(12) United States Patent
Yajima

(10) Patent No.: US 7,034,396 B2
(45) Date of Patent: Apr. 25, 2006

(54) STRUCTURE OF SEMICONDUCTOR ELEMENT AND ITS MANUFACTURING PROCESS

(75) Inventor: Tsukasa Yajima, Miyagi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/834,070

(22) Filed: Apr. 29, 2004

(65) Prior Publication Data

US 2005/0121780 A1    Jun. 9, 2005

(30) Foreign Application Priority Data

Sep. 12, 2003    (JP)    ............... 2003-321633

(51) Int. Cl.
*H01L 23/34*    (2006.01)

(52) U.S. Cl. ............... 257/728; 257/301; 257/309; 257/295; 257/308; 257/310

(58) Field of Classification Search ............... 257/295, 257/301, 306, 308, 309, 310; 438/244, 255, 438/386, 398, 399

See application file for complete search history.

(56) References Cited

U.S. PATENT DOCUMENTS

| 5,652,165 | A | 7/1997 | Lu et al. |
| 6,232,199 | B1 | 5/2001 | Wei |
| 6,403,416 | B1 | 6/2002 | Huang et al. |
| 2003/0183862 | A1* | 10/2003 | Jin et al. |

FOREIGN PATENT DOCUMENTS

| JP | 06-077430 | 3/1994 |
| JP | 2001-257316 | 9/2001 |
| JP | 2002-299555 | 10/2002 |

* cited by examiner

*Primary Examiner*—Mai-Huong Tran
(74) *Attorney, Agent, or Firm*—Volentine Francos & Whitt, PLLC

(57) ABSTRACT

A semiconductor element includes a semiconductor substrate; a film of electrode material on the substrate at a thickness corresponding to the height of a pair of confronting electrodes standing vertical; a gap in the film of electrode material at a position so that confronting surfaces of the electrodes are formed as having a width corresponding to an interval of the confronting surfaces of the electrodes; and an insulating film in the gap. Then, a pair of confronting electrodes is formed by etching the film of electrode material. An intermediate film is formed on the pair of confronting electrodes; plugs are connected to the pair of confronting electrodes through the intermediate film; and finally wiring is connected to the plugs.

7 Claims, 5 Drawing Sheets

S=10um × 1um × 13=130um²

STRUCTURE OF SEMICONDUCTOR ELEMENT AND ITS MANUFACTURING PROCESS

BACKGROUND OF THE INVENTION

1. Field of the Invention

The present invention relates to a structure of semiconductor element with MIM(Metal, Insulator, Metal) capacitor used in RF circuit or analog circuit, which is made up of a pair of parallel plates standing vertically to a substrate, and its manufacturing process.

2. Description of the Related Art

Recently, apparatus in the wireless communication field, such as handy phone, have been developed very well. And, still faster communication and more miniaturized apparatus are required. So, in these days, IC for RF circuit is requested to be highly integrated and low-cost.

In IC for RF circuit of conventional art, GaAs semiconductor or bipolar transistor have been used. However, they are costly and not suitable for integration of base band section etc.

Under the circumstances, recently, miniaturization technique of CMOS has been developed and its operation frequency has become high. Therefore, it has become possible to integrate the base band section with CMOS.

This CMOS technique is especially excellent in high integration at low price. So, by utilizing this, technique to mount RF circuit section and base band section on same chip, is going to be developed.

However, it is necessary for integration of RF circuit with CMOS, to mount RF circuit performing wireless communication and analog circuit giving interface with human, on same chip. And, inactive elements mounted on this kind of chip, are capacitor, inductor, varactor etc.

Among these elements, as for capacitor, generally, MIM structure is adopted, because it can be easily formed in manufacturing process, and because it depends on voltage little. So, capacitor structure of MIM should be adopted for miniaturization.

However, the conventional capacitor with horizontal structure, that is, capacitor structure with insulating film between a pair of horizontal electrode plate, has limit in miniaturization.

By the way, as conventional capacitor, as for DRAM, there is provided what is enhanced capacity by adopting double cylindrical electrode (c.f. JP6-77430, U.S. Pat. No. 5,652,165, U.S. Pat. No. 6,232,199, U.S. Pat. No. 6,403,416).

Moreover, as other conventional capacitor, there is provided what is enhanced capacity by adopting a pair of upper and lower horizontal electrode plates with confronting columns attached to the confronting surfaces of said electrode plates (c.f. JP2002-299555).

However, these conventional methods cannot make remarkable progress in miniaturization of capacitor, because these methods is no more than what is adopted auxiliary means of double cylinder or confronting columns.

SUMMARY OF THE INVENTION

What is achieved by present invention is that miniaturization of capacitor has made a remarkable progress.

The structure of semiconductor element according to present invention, comprises a pair of confronting electrodes formed with its confronting surface standing vertical to the surface of a substrate, and an insulating film filled in a gap between the confronting surface of the pair of vertical confronting electrodes.

Moreover, the manufacturing process of semiconductor element according to present invention, comprises a step of forming a film of electrode material at a thickness corresponding to the height of a pair of confronting electrodes standing vertical with its confronting surfaces being vertical to the surface of substrate, a step of forming a gap in the film of electrode material at a position where confronting surfaces of confronting electrodes are formed with width corresponding to the interval of electrode surfaces, a step of filling an insulating film in the gap, and a step of forming a pair of confronting electrodes by etching the film of electrode material.

According to the structure of semiconductor element and its manufacturing process of present invention, capacity at unit area in MIM capacitor is able to increase. As a result, merit of high integration in RF circuit can be obtained.

DESCRIPTION OF THE PREFERRED EMBODIMENTS

A capacitor having vertical structure is realized by usual lithography and etching technique.

<Embodiment 1>

Figure 1:
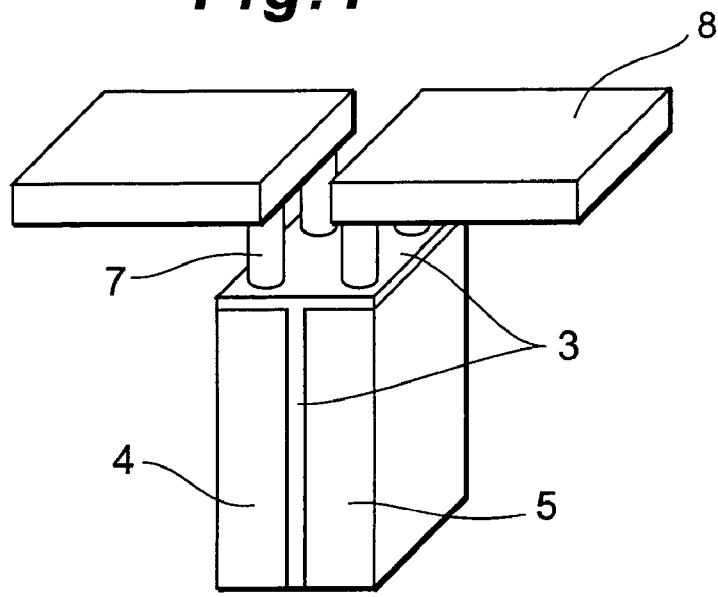
FIG. 1 is a slanted front view showing the structure of semiconductor element of present invention (Embodiment 1).

FIG. 1 shows the chief section of the structure of semiconductor element of present invention.

The structure shown in FIG. 1 is a MIM capacitor structure formed standing vertical. In this structure, there are an insulating film 3, and a pair of confronting electrodes 4, 5. Moreover, there are plug 7, and wiring 8.

The insulating film 3 is filled vertically in a gap between a pair of confronting electrodes 4, 5. Therefore, a vertical capacitor structure is realized.

A pair of confronting electrodes 4, 5 are formed standing vertical to a substrate (not shown).

The gap between a pair of confronting electrodes 4, 5 is made up of both side walls consisted of confronting end surfaces of confronting electrodes 4, 5. And, the insulating film 3 is sandwiched between confronting end surfaces of confronting electrodes 4, 5.

A pair of confronting electrodes 4, 5 and wiring 8 are connected with plug 7. In this occasion, plug 7 is connected at upper surface (in the drawing) of confronting electrodes 4, 5, that is, a portion of the peripheral surface of confronting electrodes 4, 5. And, on this portion of the peripheral surface of confronting electrodes 4, 5, there is a portion of the insulating film 3 as well.

A pair of confronting electrodes 4, 5 are made from a metallic film of a prescribed thickness (for example, 10000 Angstrom). And, at a portion of this metallic film, a gap of prescribed width is formed. This width is about 10 times as narrow as the thickness of metallic film. Then, the insulating film 3 is filled in the gap.

Next, a method of forming capacitor structure mentioned above in FIG. 1, that is, a manufacturing method of structure of semiconductor element of present invention will be described referring to FIGS. 2 to 7.

Figure 2:
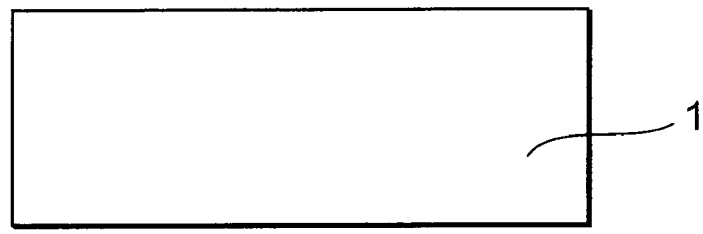
FIG. 2 shows the first stage of manufacturing process of semiconductor element of present invention (Embodiment 1).

First of all; after providing a semiconductor substrate (not shown); a step of forming a film of electrode material 1 of metallic film on substrate is performed (cf. FIG. 2). By this step, a film of electrode material at a thickness corresponding to the height of a pair of confronting electrodes 4, 5 standing vertical, is formed. That is, confronting surfaces of electrodes 4, 5 is vertical to surface of substrate. This step is performed by depositing, for example, Al—Cu with spattering method. A definite thickness of electrodes 4, 5 is, for example, 10000 Angstrom.

Figure 3:
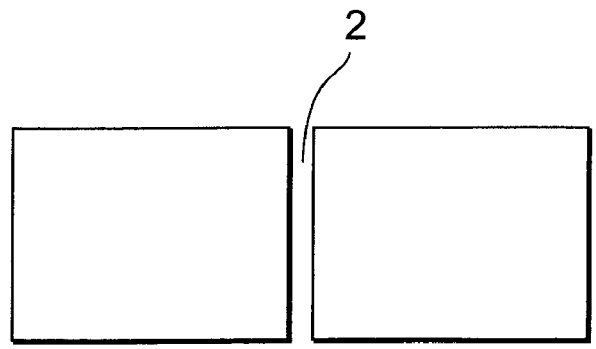
FIG. 3 shows the second stage of manufacturing process of semiconductor element of present invention (Embodiment 1).

After this step; a step of forming a gap 2 in the film of electrode material 1; is performed (cf. FIG. 3). By this step, a gap 2 at a position where confronting surfaces of electrodes 4, 5 exist, is formed with width corresponding to interval of confronting surfaces of electrodes 4, 5. This step is performed by applying resist to film of electrode material 1, by patterning this resist and by dry-etching this film of electrode material 1 according to the patterning.

Figure 4:
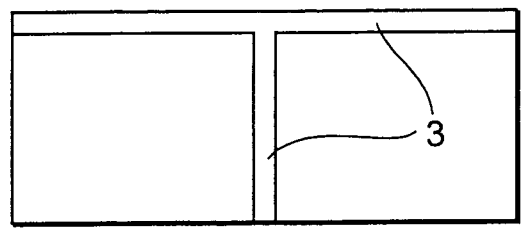
FIG. 4 shows the third stage of manufacturing process of semiconductor element of present invention (Embodiment 1).

Next, a step of filling an insulating film 3 in gap 2 is performed (cf. FIG. 4). This step is performed by depositing insulating film 3 with, for example, CVD. The kind of insulating film 3 is selected from nitrogen oxide film, oxide film, nitride film according to the capacity needed in circuit on the substrate. The thickness of film is set to be able to fill insulating film 3 into gap 2.

Here, insulating film 3 is not only filled into gap 2 but also formed on the upper surfaces of film of electrode material 1. It is necessary to fill insulating film 3 sufficiently in gap 2 for the purpose of isolating electrodes completely. For this purpose, insulating film 3 should be deposited to flow out of opening of gap 2. As a result, another portion of insulating film 3 is formed on upper surfaces of film of electrode material 1.

However, another portion of insulating film 3 is useful to decrease electric field leaking at the end portion of capacitor. Moreover, it is useful to ensure isolation of plugs 7 connected to electrodes 4, 5, which are formed afterward (cf. FIG. 7).

Figure 5:
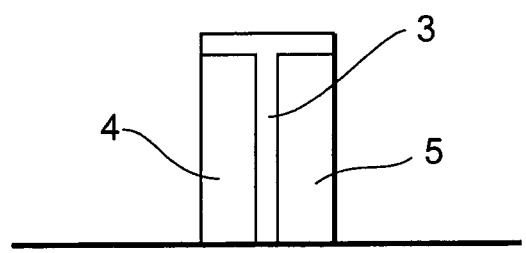
FIG. 5 shows the fourth stage of manufacturing process of semiconductor element of present invention (Embodiment 1).

After this step, a step of forming a pair of confronting electrodes by etching said film of electrode material 1, is performed (cf. FIG. 5). This step is performed by patterning resist applied to film of electrode material 1, and by dry-etching insulating film 3 and this film of electrode material 1 according to the patterning.

Figure 6:
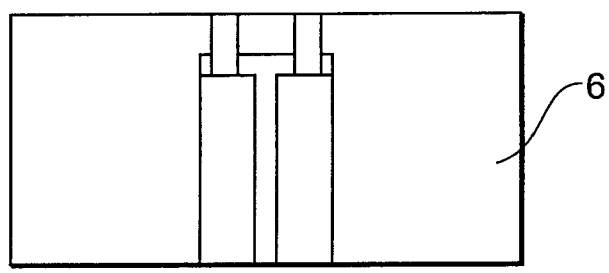
FIG. 6 shows the fifth stage of manufacturing process of semiconductor element of present invention (Embodiment 1).

Next, an intermediate film 6 is formed on the structure formed as mentioned above (cf. FIG. 6). This is performed by depositing, for example, 15000 Angstrom with CVD method. And, the surface is polished with CMP method. Thus, it is planed.

After this, contact holes are opened through intermediate film 6 and upper portion of insulating film 3.

Figure 7:
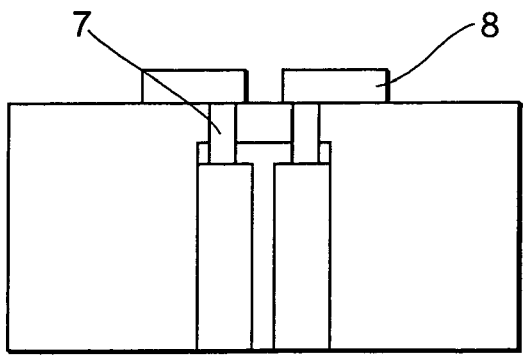
FIG. 7 shows the sixth stage of manufacturing process of semiconductor element of present invention (Embodiment 1).

And, plugs 7 are connected to the pair of confronting electrodes 4, 5 (cf. FIG. 7). This is performed by depositing tungsten and by polishing all the surface with CMP method.

Finally, wiring 8 is connected to plugs 7. That is, Al—Cu is deposited, for example, 5000 Angstrom with spattering method. And, patterning is performed with usual photolithography. Then, wiring 8 is formed with dry-etching.

As mentioned above, a structure of vertical MIM capacitor according to present invention is completely manufactured. By this structure, in MIM capacitor, capacity per unit area increases. As a result, high integration of RF circuit can be performed.

Here, overall structure of semiconductor element of present invention will be described referring to the drawings.

Figure 8:
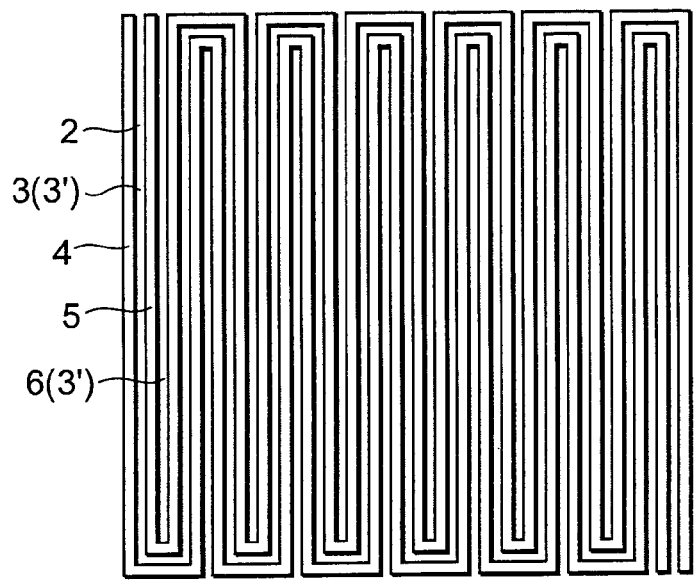
FIG. 8 shows a real structure of semiconductor element of present invention (Embodiment 1 and 2 in common).
Figure 9:
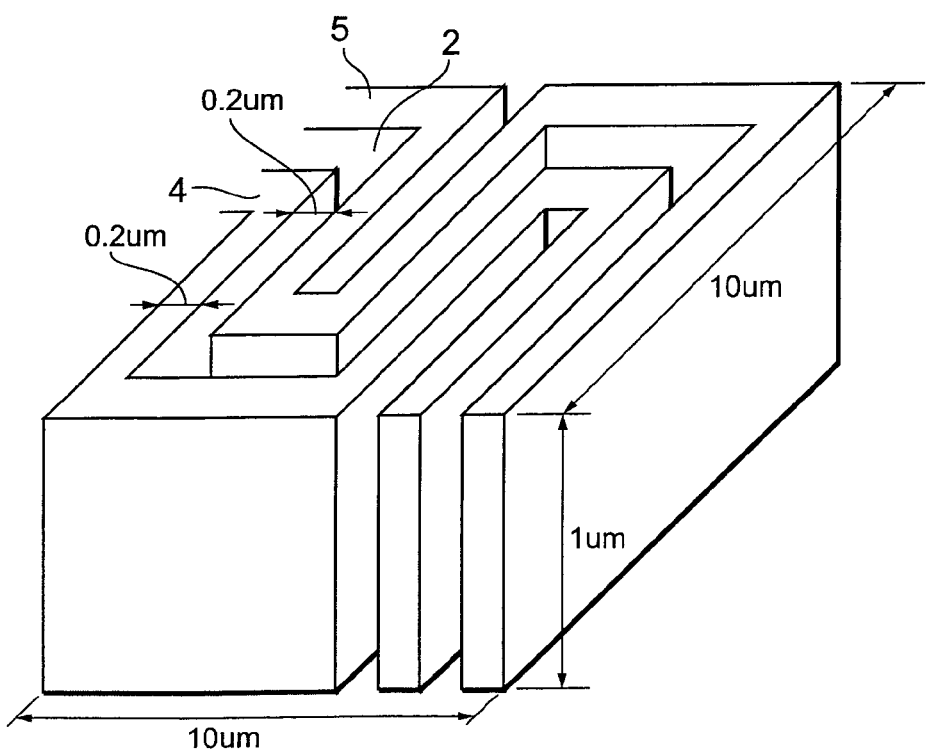
FIG. 9 shows the measurements of real structure of semiconductor element of present invention (Embodiment 1 and 2 in common).

FIG. 8 is a plan view showing a real overall structure of capacitor according to present invention. Moreover, FIG. 9 shows the measurements of the structure of FIG. 8.

As shown in FIG. 8, capacitor structure of FIG. 1 is folded in prescribed area. In this occasion, gap 2 is formed in advance at stage of process shown in FIG. 3. Then, an insulating film 3 of prescribed dielectric constant is filled in gap 2 at stage of process shown in FIG. 4. After this, a pair of confronting electrodes 4, 5 are formed at stage of process shown in FIG. 5.

The width of each of confronting electrodes 4, 5 are 0.2 μm. The height of each of them are 1 μm. The length of each of them are 130 μm. These confronting electrodes 4, 5 are folded 13 times as shown in FIG. 8, so as to put in a square of 10 μm by 10 μm.

Accordingly, total area of electrodes 4, 5 of capacitor becomes 130 μm$^2$. This is 1.3 times as large as total area of horizontal capacitor having electrodes of squares 10 μm by 10 μm.

Further, increase of capacity is expected by decreasing width of electrodes and width of gap. Then, high integration becomes possible.

Meanwhile, generally, in RF circuit, compared accuracy of capacitor is important. So, dispersion by manufacturing is expected to be restrained. However, as for MIM capacitor of vertical direction, dispersion of thickness of insulating film results in dispersion of capacity. Contrary to this, as for capacitor of vertical direction according to present invention, thickness of insulating film determining capacity is determined by difference of size of mask pattern in photolithography and etching. Therefore, dispersion of thickness of insulating film can be restrained very well. As a result, compared accuracy of capacitor increases.

<Embodiment 2>

Figure 10:
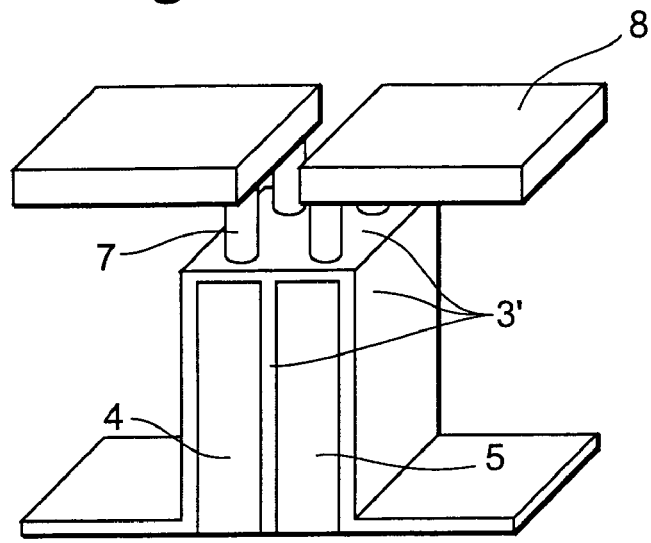
FIG. 10 is another slanted front view showing the other structure of semiconductor element of present invention (Embodiment 2).

FIG. 10 shows the chief section of the other structure of semiconductor element of present invention.

The structure shown in FIG. 10 is a MIM capacitor structure formed standing vertical. In this structure, there are an insulating film 3' and a pair of confronting electrodes 4, 5. Moreover, there are plug 7, and wiring 8.

The insulating film 3' is filled vertically in a gap between a pair of confronting electrodes 4, 5. Therefore, a vertical capacitor structure is realized.

A pair of confronting electrodes 4, 5 and wiring 8 are connected with plug 7. In this occasion, plug 7 is connected at upper surface (in the drawing) of confronting electrodes 4, 5, that is, a portion of the peripheral surface of confronting electrodes 4, 5. And, on this portion of the peripheral surface of confronting electrodes 4, 5, there is a portion of the insulating film 3' as well. Further, on the back surfaces of confronting electrodes 4, 5, there is a portion of the insulating film 3' as well.

A pair of confronting electrodes 4, 5 are made from a metallic film of a prescribed thickness (for example, 10000 Angstrom). And, at a portion of this metallic film, a gap of prescribed width is formed. This width is about 10 times as narrow as the thickness of metallic film. Then, the insulating film 3' is filled in the gap.

Next, a method of forming capacitor structure mentioned above in FIG. 10, that is, a manufacturing method of structure of semiconductor element of present invention will be described referring to FIGS. 11 to 15.

Figure 11:
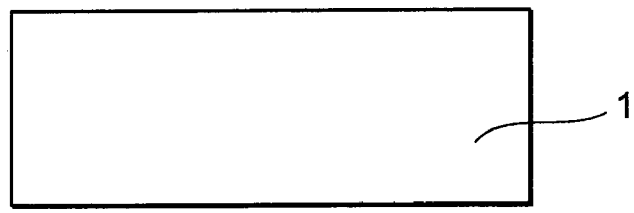
FIG. 11 shows the first stage of the other manufacturing process of semiconductor element of present invention (Embodiment 2).

First of all; after providing a semiconductor substrate (not shown); a step of forming a film of electrode material 1 on substrate is performed (cf. FIG. 11). This step is performed by depositing, for example, Al—Cu with spattering method. A definite thickness of electrodes 4, 5 is, for example, 10000 Angstrom.

Figure 12:
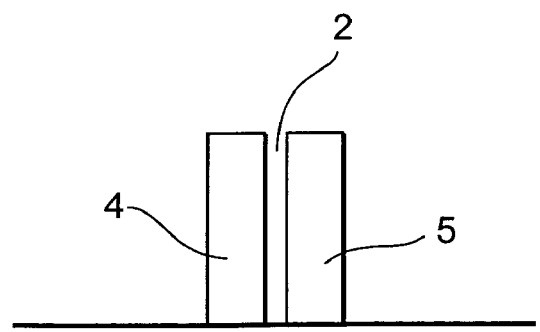
FIG. 12 shows the second stage of the other manufacturing process of semiconductor element of present invention (Embodiment 2).

After this step; a step of forming a pair of confronting electrodes by etching said film of electrode material 1, and forming a gap 2 in the film of electrode material 1; is performed (cf. FIG. 12). This step is performed by applying resist to film of electrode material 1, and by patterning this resist. Then, a pattern of a pair of confronting electrodes 4, 5 and gap 2, is formed. And, according to this patterning, by dry-etching this film of electrode material 1; a pair of confronting electrodes 4, 5 and gap 2, is formed simultaneously.

Figure 13:
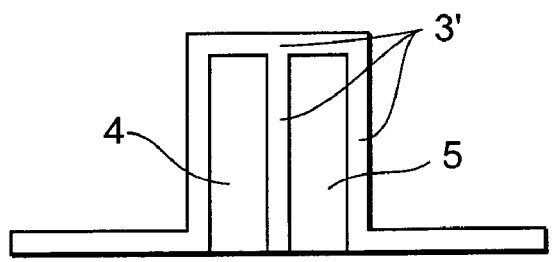
FIG. 13 shows the third stage of the other manufacturing process of semiconductor element of present invention (Embodiment 2).

Next, a step of filling an insulating film 3' in gap 2 is performed (cf. FIG. 13). This step is performed by depositing insulating film 3' with, for example, CVD. The kind of insulating film 3' is selected from nitrogen oxide film, oxide film, nitride film according to the capacity needed in circuit on the substrate. The thickness of film is set to be able to fill insulating film 3 into gap 2. An example is 0.2 μm.

Here, insulating film 3' is not only filled into gap 2 but also formed on the upper surfaces and back surfaces of a pair of confronting electrodes 4, 5. It is necessary to fill insulating film 3' sufficiently in gap 2 for the purpose of isolating electrodes completely. For this purpose, insulating film 3' should be deposited to flow out of opening of gap 2. As a result, insulating film 3' is formed on upper surfaces and back surfaces of a pair of confronting electrodes 4, 5.

However, insulating film 3' formed on upper surfaces and back surfaces of a pair of confronting electrodes 4, 5 is useful to decrease electric field leaking at the end portion of capacitor. Moreover, it is useful to ensure isolation of plugs 7 connected to electrodes 4, 5, which are formed afterward (cf. FIG. 15).

Figure 14:
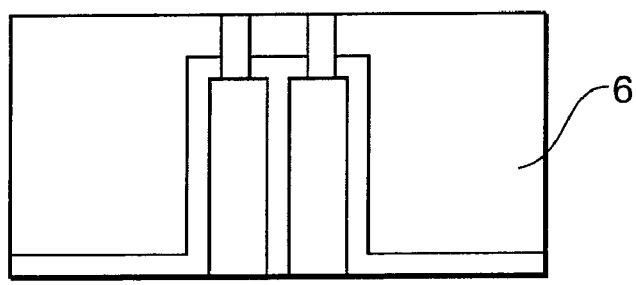
FIG. 14 shows the fourth stage of the other manufacturing process of semiconductor element of present invention (Embodiment 2).

Next, an intermediate film 6 is formed on the structure formed as mentioned above (cf. FIG. 14). This is performed by depositing, for example, 15000 Angstrom with CVD method. And, the surface is polished with CMP method. Thus, it is planed.

After this, contact holes are opened through intermediate film 6 and upper portion of insulating film 3'.

Figure 15:
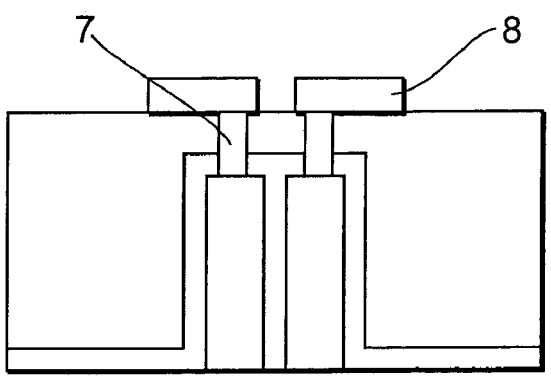
FIG. 15 shows the fifth stage of the other manufacturing process of semiconductor element of present invention (Embodiment 2).

And, plugs 7 are connected to the pair of confronting electrodes 4, 5 (cf. FIG. 15). This is performed by depositing tungsten and by polishing all the surface with CMP method.

Finally, wiring 8 is connected to plugs 7. That is, Al—Cu is deposited, for example, 5000 Angstrom with spattering method. And, patterning is performed with usual photolithography. Then, wiring 8 is formed with dry-etching.

As mentioned above, a structure of vertical MIM capacitor according to present invention is completely manufactured. By this structure, in MIM capacitor, capacity per unit area increases. As a result, high integration of RF circuit can be performed.

Moreover, as a characteristic effect of Embodiment 2, by forming a pair of confronting electrodes 4, 5 and gap 2 simultaneously; two steps of photolithography and etching become one step. This simplification of process can decrease manufacturing cost.

As similar to Embodiment 1, in Embodiment 2, as shown in FIG. 8, capacitor structure shown in FIG. 10 is folded plural times to put in prescribed area. In this occasion, by a step of process shown in FIG. 12, gap 2 and a pair of confronting electrodes 4, 5 are formed simultaneously. And, at a step of process shown in FIG. 13, insulating film 3' of prescribed dielectric constant for comprising capacitor is filled in gap 2.

What is claimed is:

1. A structure of a semiconductor element comprising:
   a substrate;
   a pair of confronting electrodes having confronting surfaces standing vertical to a surface of said substrate;
   a portion of an insulating film filled in a gap between said confronting surfaces of said pair of confronting electrodes;
   an intermediate film on said pair of confronting electrodes;
   plugs connected to said pair of confronting electrodes through said intermediate film; and
   wiring connected to said plugs.

2. The structure of a semiconductor element according to claim 1, wherein said pair of confronting electrodes are folded in a prescribed area on said substrate.

3. A structure of a semiconductor element comprising:
   a substrate;
   a pair of confronting electrodes having confronting surfaces standing vertical to a surface of said substrate;
   a portion of an insulating film filled in a gap between said confronting surfaces of said pair of confronting electrodes,
   wherein another portion of said insulating film is formed on upper surfaces of said pair of confronting electrodes.

4. The structure of a semiconductor element according to claim 3, comprising:
  an intermediate film on said pair of confronting electrodes;
  plugs connected to said pair of confronting electrodes through said intermediate film; and
  wiring connected to said plugs.

5. The structure of a semiconductor element according to claim 3, wherein still another portion of said insulating film is formed on outer side walls of said pair of confronting electrodes.

6. The structure of a semiconductor element according to claim 5, further comprising:
  an intermediate film on said pair of confronting electrodes;
  plugs connected to said pair of confronting electrodes through said intermediate film; and
  wiring connected to said plugs.

7. A manufacturing process of a semiconductor element comprising the steps of:

providing a semiconductor substrate;

forming a film of electrode material on said substrate at a thickness corresponding to a height of a pair of confronting electrodes standing vertical with confronting surfaces thereof being vertical to a surface of said substrate;

forming said pair of confronting electrodes by etching said film of electrode material, simultaneously forming a gap in said film of electrode material at a position where said confronting surfaces of said pair of confronting electrodes are formed with width corresponding to an interval of said confronting surfaces of said pair of confronting electrodes; and filling an insulating film in said gap, simultaneously forming an insulating film at upper surfaces and outer side walls of said pair of confronting electrodes.

* * * * *